Aug. 26, 1969 J. W. KELLEY ET AL 3,463,974

MOS TRANSISTOR AND METHOD OF MANUFACTURE

Filed July 1, 1966

INVENTORS
JAMES W. KELLEY
CHARLES T. PLOUGH
BY Norman M. Kunitz
Roger L. Borovoy
ATTORNEYS

United States Patent Office 3,463,974
Patented Aug. 26, 1969

3,463,974

MOS TRANSISTOR AND METHOD OF MANUFACTURE

James W. Kelley, Sunnyvale, and Charles T. Plough, Portola Valley, Calif., assignors to Fairchild Camera and Instrument Corporation, Syosset, N.Y., a corporation of Delaware Filed July 1, 1966, Ser. No. 562,402
Int. Cl. H01l 7/00
U.S. Cl. 317—235 2 Claims

ABSTRACT OF THE DISCLOSURE

A field effect transistor having a dielectric layer with two portions, the first portion under the gate overlying the channel region and having a surface charge density less than about $5 \times 10^{-11}$ charges per square centimeter, and a second portion over the remainder of the surface having a higher surface charge density in excess of about $1 \times 10^{-12}$ charges per square centimeter.

Figure 1:
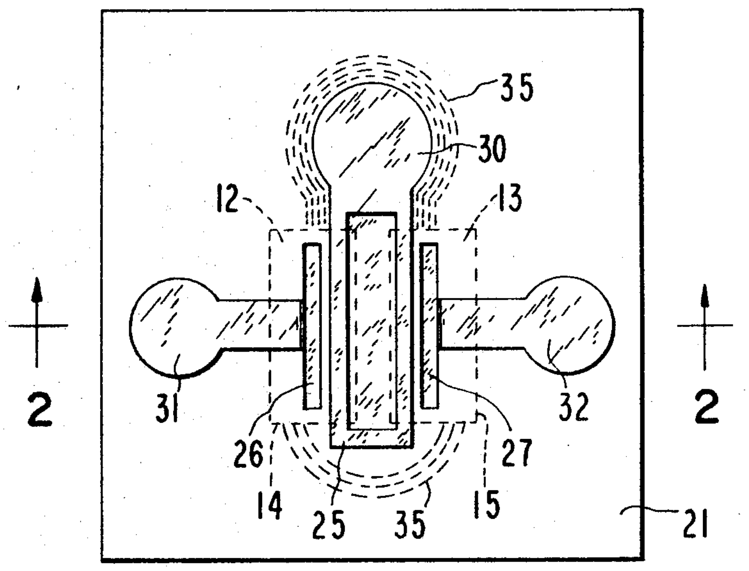

This invention relates to an improved field effect transistor of the metal-dielectric-semiconductor type which, due to the fact that the dielectric is usually an oxide, is often referred to as a MOST. More particularly, this invention relates to a MOST of the P channel type wherein the dielectric layers on the surface thereof are optimized to prevent undesired inversions of the semiconductor material in areas not below the gate electrode. The device is thereby optimized against failure due to leakage current, i.e., uncontrollable currents between the source and the drain. Simultaneously, the device is essentially optimized for its sensitivity to low input voltages on the gate.

In the P channel type of MOST with which this invention is concerned, a monocrystalline semiconductor substrate of N-type conductivity is provided with a pair of closely spaced source and drain regions of P+ type conductivity which form respective P-N junctions with the substrate. A metal gate electrode is disposed over the region between the source and the drain and separated from the region by means of an insulating or dielectric layer. In the normally off, or enhancement type MOST, the application of a negative potential between the gate and the substrate of proper magnitude results in the inversion of the surface of the semiconductor material directly below the gat electrode. The inverted surface layer causes a conductive path or P-type channel to be formed between the source and the drain regions, with the conductivity of the channel being a function of the magnitude of the applied potential. The inverted layer may be eliminated by applying zero potential or a positive potential to the gate electrode.

The voltage necessary to invert the semiconductor material and form the current path is called the turn-on voltage ($V_T$) and is related to the device structure by the following equation:

$$V_T = \frac{(Q_{SS} + Q_B) X_o}{K \epsilon_o}$$

where:

$X_o$ is the thickness of the dielectric over the area to be inverted, in centimeters $Q_B$ is the charge in the surface layer of the semiconductor in coulombs per square centimeter $Q_{SS}$ is the charge in the dielectric at the semiconductor-dielectric interface in the region to be inverted in coulombs per square centimeter K is the dielectric constant of the dielectric (3.9 for $SiO_2$)

$\epsilon_o$ is the free space permittivity $= 8.85 \times 10^{-14}$ farads per centimeter For a P channel MOST structure, $Q_B$ is positive and of a magnitude equal to the exposed donor atoms in the semiconductor. $Q_{SS}$ is for all practical purposes always a positive charge whose value depends on the nature of the dielectric layer, i.e., the particular material and the manner in which it is formed. Although dielectrics wherein $Q_{SS}$ is a negative charge have been observed, e.g., a gold doped silicon oxide, these are special and not normally occurring situations. Moreover, with the present state of technology, very little is known about how to stabilize these negative $Q_{SS}$ dielectrics or how to control their charge values. Accordingly, it is to be understood that as used herein, $Q_{SS}$ is always a positive charge.

Since it is normally desirable that a MOST structure have as low a turn-on voltage as possible, and since the value of $Q_B$ is relatively fixed, low turn-on voltages for MOST devices are usually achieved by using relatively thin dielectric layers over the gate region and/or dielectrics which have a very low surface charge density ($Q_{SS}/q$, where $q$ is the charge on the electron and is equal to $1.6 \times 10^{-19}$ coulombs). In a typical silicon-silicon dioxide MOST structure the surface charge density of the silicon ($Q_B/q$) is approximately $2 \times 10^{11}$ cm.$^{-2}$, the oxide thickness in the gate region is approximately 1,000 A., and the surface charge density of the silicon dioxide layer in the gate region ($Q_{SS}/q$) is approximately $3 \times 10^{11}$ cm.$^{-2}$, resulting in a turn-on voltage for the device of about −2 to −3 volts.

Although the inversion of the semiconductor surface beneath the gate region by means of an electric field generated by a voltage applied to the gate electrode is a desirable characteristic of a MOST device, inversions of the semiconductor surface in regions outside of the channel region are generally undesirable. Such inverted regions cannot be returned to their original state by merely removing the gate voltage from the gate electrode. In contrast to a time of approximately $10^{-9}$ seconds required for the inversion layer beneath a gate electrode to return to its normal condition after the removal of the gate voltage, days or months may be required for an inverted layer outside of the gate region to return to its normal condition. Because of this relatively long and uncontrollable return time, any such inverted region which results in a current path between the source and the drain will effectively cause the device to fail since the device cannot be turned off, i.e., made nonconducting.

In the use of enhancement mode MOST devices, it often happens that a gate voltage is applied to the gate electrode for relatively long periods of time, e.g., hours or days. In addition to maintaining the semiconductor in the channel region in its inverted state, the voltage applied to the gate electrode also causes a redistribution of the charge on the surface of the semiconductor substrate in the area adjacent the gate electrode until finally an external ring of charge surrounding the gate electrode is formed. The potential of the external ring of charge continues to increase as long as the gate voltage is applied, until it reaches the voltage applied to the gate. Since the voltage applied to the gate is often many times greater than the turn-on voltage for the channel region, the resulting potential of the ring of charge may be sufficiently high to cause inversion of the semiconductor surface outside of the gate region and thereby form an external current path in the device between the source and the drain. The mode of failure whereby an uncontrollable current path is formed (i.e., a current path external to the channel region linking the source and drain) is commonly referred to as the "link current failure" mode for the device. In an effort to eliminate or minimize this type of current failure or link current failure mode, the dielectric layer outside of the gate region is usually formed in a manner whereby it is substantially greater in thickness than the dielectric layer in the gate region. For example, in the example of a MOST device given above, the oxide thickness outside of the gate region would typically have a value of approximately 10,000 A. resulting in a turn-on voltage of approximately −20 to −30 volts for any external channel. However, voltages greatly in excess of −20 to −30 volts, for example −50 to −60 volts, are commonly applied to the gate electrode of a MOST. Since fabrication techniques under present day technology are usually optimized for a minimum turn-on voltage, and since lower and lower values of the turn-on voltage are being achieved by means of improved technology in dielectric formation to produce smaller values of $Q_{SS}$, the sensitivity of MOST devices to the link current mode of failure is a very real problem which is tending to increase.

In order to eliminate or at least minimize the problem of link current mode of failure of MOST devices while at the same time not sacrificing the optimization of the device for low turn-on voltage, according to the invention, the MOST device is fabricated in such a manner that the effective turn-on voltage for any external channel is materially increased. Briefly, the field effect transistor according to the invention comprises a monocrystalline semiconductor wafer of N-type conductivity having first and second regions of P-type conductivity located therein and forming respective first and second P–N junctions which extend to a major surface of the wafer. The P-N junctions are spaced apart to define the ends of a channel region within the wafer. A first dielectric layer having a relatively low surface charge density is located on the major surface overlying the channel region and extending to the adjacent portions of the P–N junctions, while the remainder of the major surface of the substrate is covered with a layer of dielectric having a relatively high surface charge density. Overlying the dielectric layer of relatively low surface charged density is a metallic gate electrode, while ohmic contacts are provided for the first and second P-type conductivity regions which constitute the source and drain of the transistor.

Although any dielectric material having the desired surface charge density may be utilized to fabricate the device according to the invention, e.g., silicon dioxide could be used for the dielectric material over the gate region and silicon nitride for the dielectric material over the remaining portion of the device, preferably each of the two dielectric layers is a silicon oxide which has been formed by a separate oxide producing process. For example, it is well known that an oxide which is thermally grown in a dry atmosphere and at a high temperature (above 900° C.) will have a low surface charge density, i.e., in the order of $3\times10^{11}$ cm.$^{-2}$, whereas an oxide thermally grown in the presence of steam (commonly called a steam oxide) will have a relatively high surface charge density, i.e., in the order of $1\times10^{12}$ cm.$^{-2}$. Moreover, most silicon dioxide layers formed by so-called low temperature processes, such as anodically grown or deposited oxide layers, have a relatively high surface charge density when originally formed. It has been found however, that the oxides exhibiting the high surface charge density, i.e., the steam and low temperature formed oxides, can be converted to oxides having a low surface charge density by heating the oxides in an inert atmosphere or a vacuum at a temperature in the vicinity of 600° C. and above. Accordingly, care must be taken in the fabrication of the device according to the invention to insure that the dielectric layers in the final device have the desired characteristics.

Briefly, the method according to the invention comprises the improvement in the standard manufacturing process for MOST devices of first forming a layer of dielectric material having a low surface charge density over the channel region of the device and the adjacent portions of the P-N junctions, and then forming a dielectric layer having a relatively high surface charge density over the remainder of the device in a manner so as not to substantially change the surface charge density of the dielectric layer over the channel region.

Figure 2:
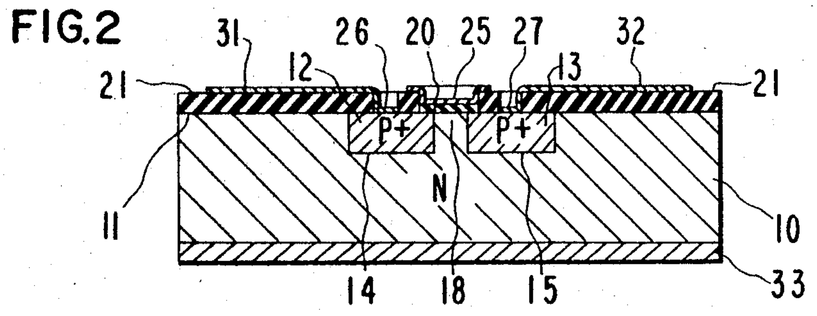

The invention and the advantages thereof will be more clearly understood from the following detailed description taken in conjunction with the attached drawings wherein:

FIG. 1 is a greatly enlarged plain view of a MOS transistor according to the invention; and FIG. 2 is a sectional view of the transistor structure according to the invention taken along line 2—2 of FIG. 1.

Referring now to FIGS. 1 and 2, there is shown a structure which although slightly different in overall appearance, functions in the same manner as the well known field-effect transistors of the inversion type such as shown in U.S. Patent No. 3,056,888 issued to M. M. Atalla on Oct. 2, 1962 and U.S. Patent No. 3,102,270, issued to Dawon Kahng on Aug. 27, 1963. As shown in the figures, the device comprises a substrate or wafer 10 of a monocrystalline semiconductor material, preferably silicon, and having N-type conductivity. Located within the wafer 10 adjacent a major surface 11 thereof are spaced first and second regions 12 and 13 respectively of P-type conductivity. The regions 12 and 13, which are formed by well known diffusion and photoresist techniques, form respective planar P–N junctions 14 and 15 with the wafer 10, extending to the major surface 11. The portion 18 of the wafer 10 between the regions 12 and 13 is referred to as the channel region of the MOST device.

Formed on the surface 11 overlying the channel region 18 and extending over the adjacent portions of the junctions 14 and 15 is a layer 20 of dielectric material, preferably silicon dioxide. In order, as indicated above, to provide for the optimization of the turn-on voltage for the device, the dielectric layer 20 is usually made as thin as possible, for example, 1000 A. is a typical thickness for silicon dioxide. Additionally, the turn-on voltage may also be optimized by choosing a dielectric material having a low surface charge density. Although a typical desired value of surface charge density for the dielectric layer 20 is about $2\times10^{11}$ cm.$^{-2}$, values not exceeding $5\times10^{11}$ cm. $^{-2}$ are still considered low enough to provide stable dielectric layers resulting in sufficiently low turn-on voltages for the devices.

In the conventional MOST, the remainder of the surface 11, except for openings for the connection of ohmic contacts to regions 12 and 13, is also covered with the same dielectric material as that used over the gate region 18. According to the invention, however, the remainder of the surface 11 is covered with a different dielectric layer 21, which, although it may have the same chemical composition as layer 20, has a relatively high surface charge density. The reasons for this change and the limits thereof will be discussed further below.

Deposited on the exposed surface of dielectric layer 20 is a metal electrode 25 for the purpose of applying an electrical field to the channel region 18 and the adjacent portion of the P–N junctions 14 and 15. Although the electrode 25 preferably covers at least the entire surface of the layer 20, the invention is not so limited. The only requirement for the electrode 25 is that it cover the channel region 18 and extend over a portion of the regions 12 and 13. Metallized ohmic electrical contacts 26 and 27 are provided for the regions 12 and 13. Preferably as indicated, the contacts 25–27 terminate in enlarged portions 30–32 respectively which serve as bonding pads to facilitate the connection of the device to other electrical components. Electrical connection to the body 10 is made by means of a contact 33, which as shown in the figure is a layer of metal on the bottom surface of body 10. The control gate electrode 25 and metallized contacts 26, 27, and 33 may be formed by well known techniques in the semiconductor art, for example, as disclosed in U.S. Patent 2,981,877, issued Apr. 25, 1961 to R. N. Noyce.

In the operation of the device so far described, the application of a negative potential to the gate electrode 25 will cause an inversion of the surface layer of the N-type semiconductor material in the channel region 18, resulting in a P-type channel or current path being formed between regions 12 and 13. The application of this potential will, however, also cause a redistribution of the charges on the surface of the wafer 10 beneath the dielectric layers adjacent to the electrode, until finally a condition whereby rings of charge such as indicated by the dotted lines 35 in FIG. 1 are formed. The potential of this external ring of charge will continue to increase as long as the potential is applied to the electrode 25 until it is finally equal to the applied potential. Accordingly, if the gate voltage is greater than the turn-on voltage for the semiconductor layer beneath the ring of charge, and if the gate voltage is applied for a sufficiently long time, e.g., days or weeks, to allow the potential of the ring of charge to reach the potential of gate voltage, then inversion of the semiconductor material beneath the ring of charge will take place and result in the formation of an uncontrollable current path between the source and drain regions 12 and 13 of the MOST. In an effort to eliminate this problem, as indicated in the drawings, the dielectric layer in the regions covered by the layer 21 is usually made thicker than the dielectric thickness over the gate region 18, thereby increasing the turn-on voltage for any external uncontrollable current paths. Normally this increased thickness reaches a maximum of about 10,000 A. However, since the potential applied to the gate electrode is often greater than the resulting turn-on voltage, according to the invention, the dielectric layer 21 is formed to have a high surface charge density. Preferably, the surface charge density of layer 21 should not be less than $1 \times 10^{12}$ cm.$^{-2}$ which would result in a turn-on voltage for any external channel of about $-70$ to $-100$ volts. This is considerably more than the voltages commonly applied to MOS transistors.

Turning now to the fabrication or manufacture of the device according to the invention, as pointed out above except for the presence of two different dielectric materials, the device is similar to prior art MOST devices. Hence, the device may be manufactured using conventional processes with the one exception that two separate dielectric forming processes rather than one must be used.

In the normal manufacturing process for MOS transistors, in order to produce a stable device, after the diffusion steps the oxide layer on the surface of the device which has been contaminated by the dopants used in the diffusions is removed and a new layer of dielectric is formed by any of the well known methods. For example, a silicon oxide may be grown, either thermally or anodically, or deposited, e.g., by means of sediment at ion evaporation, vapor deposition, or pyrolytic deposition techniques. Since it is desired that the oxide have a low surface charge density, i.e., under $5 \times 10^{11}$ cm.$^{-2}$, the oxide is usually a thermally grown oxide (grown at about 1200° C. in a dry or inert atmosphere). However, thermally grown steam oxides which have been baked at a high temperature (about 1000–1200° C.) in an inert atmosphere and an anodically grown or deposited oxides which have been baked in a vacuum or an inert atmosphere at a temperature between 750° and 900° C. may also be used. Thermally grown steam oxides, anodically grown oxides, and deposited oxides usually have a high surface charge density as originally formed, requiring the baking step.

In the fabrication of the device according to the invention, as indicated above, any dielectric having the desired charge density characteristic may be used. However, because dielectric layers having two different surface charge densities are required, care must be taken in the manner in which the dielectric layers are formed so that the resulting layers will have the desired characteristic. For example, if the dielectric layer having the high surface charge density were formed by means of a thermally grown high temperature steam oxide, any subsequent attempts to form the low surface charge density dielectric layer by anodically growing an oxide layer would reduce the thermally grown oxide to a low surface charge density oxide. This is due to the fact that the vacuum bake step of the anodic oxide which is necessary to reduce the oxide to a low surface charge density oxide takes place at a temperature above 600° C. It has been found that the surface charge density of oxides changes above this temperature. Accordingly, the order in which the dielectric layers or oxides of the MOST according to the invention are formed becomes exceedingly important.

Since it appears that in order to produce an oxide having a low surface charge density, the oxide must either be formed or later heated at a temperature above 600° C., the preferred embodiment of the method according to the invention entails forming the dielectric oxide layer 20 first and then forming the oxide layer 21 under conditions which will not substantially change the surface charge density of layer 20. For example, a high temperature thermally grown steam oxide should not be used for the layer 21 since the layer 20 will be converted to an oxide with a high surface charge density during the formation of the layer 21.

As examples of methods by which the two oxide layers can be formed, the gate oxide may first be either thermally grown at about 1200° C. in a dry or inert atmosphere, anodically grown followed by vacuum bake at a temperature between 750–900° C., or vapor deposited followed by a vacuum bake at about 900° C. The second layer of oxide (layer 21) may then be formed by a low temperature, i.e., below 600° C., oxide forming process, e.g., anodic growing or vapor deposition, which is not followed by heating the formed oxide to a temperature above 600° C.

Although the device has been described for P-channel MOST devices with dielectrics wherein $Q_{SS}$ is a positive charge, as indicated above this is due to the unavailability and lack of knowledge of dielectrics wherein $Q_{SS}$ is a negative charge. Accordingly, it is conceivable that when and if this latter type of dielectric is readily available, that the basic concept of this invention, i.e., the use of two different dielectrics with different surface charge densities, can be applied to N-channel devices.

Obviously, various modifications of the invention are possible in light of the disclosure without departing from the spirit of the invention. Accordingly, the invention is to be limited only as indicated by the scope of the appended claims.

What is claimed is:

1. A field effect transistor comprising:

a monocrystalline semiconductor wafer of N-type conductivity;

first and second regions of P-type conductivity located within said wafer and forming respectively first and second P–N junctions which extend to a major surface of said wafer, said first and second regions being spaced apart to define the ends of a channel region wherein upon application of a suitable electric field a channel will be formed so that current may flow between said first and second regions;

a first dielectric layer having a surface charge density less than about $5 \times 10^{11}$ charges per square centimeter located on the portion of said major surface overlying said channel region and the portion of said first and second junctions adjacent thereto;

an electrode overlying said first dielectric layer for applying an electrical field to said channel region and the adjacent portions of the respective junctions;

means for making ohmic contact to said first and second regions; and a second dielectric layer having a surface charge density in excess of about $1 \times 10^{12}$ charges per square centimeter overlying the remaining portions of said major surface.

2. The transistor of claim 1 wherein said semiconductor material is silicon and wherein both of said first and second dielectric layers are oxides of silicon.

References Cited

UNITED STATES PATENTS

| | | | |
|---|---|---|---|
| 3,336,661 | 8/1967 | Polansky | 29—589 |
| 3,233,123 | 2/1966 | Heiman | 307—88.5 |
| 3,339,128 | 8/1967 | Olmstead | 317—235 |
| 3,246,173 | 4/1966 | Silver | 307—88.5 |

JAMES D. KALLAM, Primary Examiner

M. EDLOW, Assistant Examiner

U.S. Cl. X.R.

307—304; 317—234

UNITED STATES PATENT OFFICE
CERTIFICATE OF CORRECTION

Patent No. 3,463,974 August 26, 1969

James W. Kelley et al.

It is certified that error appears in the above identified patent and that said Letters Patent are hereby corrected as shown below:

Column 1, line 19, "$10^{-11}$" should read -- $10^{11}$ --; line 22, "$10^{-12}$" should read -- $10^{12}$ --.

Signed and sealed this 21st day of April 1970.

(SEAL)
Attest:

Edward M. Fletcher, Jr.
Attesting Officer

WILLIAM E. SCHUYLER, JR.
Commissioner of Patents